(12) United States Patent
Tanzawa

(10) Patent No.: US 10,573,728 B2
(45) Date of Patent: Feb. 25, 2020

(54) FIELD EFFECT TRANSISTORS HAVING A FIN

(71) Applicant: MICRON TECHNOLOGY, INC., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/108,899

(22) Filed: Aug. 22, 2018

(65) Prior Publication Data

US 2018/0374937 A1    Dec. 27, 2018

Related U.S. Application Data

(62) Division of application No. 14/294,266, filed on Jun. 3, 2014, now Pat. No. 10,096,696.

(51) Int. Cl.
| | |
|---|---|
| *H01L 27/00* | (2006.01) |
| *H01L 29/66* | (2006.01) |
| *H01L 29/78* | (2006.01) |
| *H01L 29/06* | (2006.01) |
| *H01L 27/112* | (2006.01) |

(52) U.S. Cl.
CPC .... *H01L 29/66795* (2013.01); *H01L 29/0657* (2013.01); *H01L 29/785* (2013.01); *H01L 27/11286* (2013.01)

(58) Field of Classification Search
CPC .................................................. H01L 29/7853
See application file for complete search history.

(56) References Cited

U.S. PATENT DOCUMENTS

| | | | |
|---|---|---|---|
| 5,554,550 | A | 9/1996 | Yang |
| 6,555,870 | B1 * | 4/2003 | Kirisawa ............... H01L 27/115 257/324 |
| 8,664,064 | B2 | 3/2014 | Kim et al. |
| 2003/0197221 | A1 | 10/2003 | Shinozaki et al. |
| 2010/0048011 | A1 | 2/2010 | Yeh et al. |
| 2013/0264621 | A1 | 10/2013 | Nishi et al. |
| 2014/0070320 | A1 | 3/2014 | Mukherjee et al. |

(Continued)

OTHER PUBLICATIONS

M. Crowley, et al, "512Mb PROM with 8 Layers of Antifuse/Diode Cells," 2003 IEEE International Solid State Circuits Conference, Feb. 11, 2003, pp. 10.

(Continued)

*Primary Examiner* — Kimberly N Rizkallah
*Assistant Examiner* — Alexander Belousov
(74) *Attorney, Agent, or Firm* — Dicke, Billig & Czaja, PLLC

(57) ABSTRACT

Transistors might include first and second semiconductor fins, a first source/drain region in the first semiconductor fin and extending downward from an uppermost surface of the first semiconductor fin, a second source/drain region in the second semiconductor fin and extending downward from an uppermost surface of the second semiconductor fin, a dielectric between the first and second semiconductor fins and adjacent to sidewalls of the first and second semiconductor fins, and a control gate over the dielectric and between the first and second semiconductor fins and extending to a level below upper surfaces of the first and second source/drain regions.

1 Claim, 13 Drawing Sheets

(56) References Cited

U.S. PATENT DOCUMENTS

2014/0239354 A1   8/2014   Huang et al.
2015/0228794 A1   8/2015   Hsiao et al.

OTHER PUBLICATIONS

M. Johnson, et al., "512-Mb PROM With a Three-Dimensional Array of Diode/Antifuse Memory Cells," IEEE Journal of Solid-State Circuits, vol. 38, No. 11, Nov. 2003, pp. 1920-1928.
R. Katsumata, et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
J. Jang, et al., "Vertical Cell Array using TCAT (Terebit Cell Array Trasistor) Technology for Ultra High Density NAND Flash Memory," 2009 Symposium on VLSI Technology Digest of Technical Papers, pp. 192-193.
H. Kawasaki, et al., "Challenges and Solutions of FinFET Integration in an SRAM Cell and a Logic Circuit for 22 nm node and beyond," 2009 IEEE, pp. 289-292.
T. Tanzawa, et al. "Circuit Techniques for a 1.8-V-Only NAND Flash Memory," IEEE Journal of Solid-State Circuits, vol. 37, No. 1, Jan. 2002, pp. 84-89.
J. Kim, et al., "Novel Vertical-Stacked-Array-Transistor (VSAT) for Ultra-high-density and cost-effective NAND Flash memory devices and SSD (Solid State Drive)," 2009 Symposium on VLSI Technology Digest of Technical Papers, pp. 186-187.
W. Kim, et al., "Multi-Layered Vertical Gate NAND Flash Overcoming Stacking Limit for Terabit Density Storage," 2009 Symposium on VLSI Technology Digest of Technical Papers, pp. 188-189.

* cited by examiner

FIELD EFFECT TRANSISTORS HAVING A FIN

RELATED APPLICATION

This Application is a Divisional of U.S. application Ser. No. 14/294,266, titled "FIELD EFFECT TRANSISTORS HAVING A FIN," filed Jun. 3, 2014, (allowed) now U.S. Pat. No. 10,096,696 issued on Oct. 9, 2018, which is commonly assigned and incorporated herein by reference.

FIELD

The present disclosure relates generally to field effect transistors, and, in particular, the present disclosure relates to field effect transistors having a fin.

BACKGROUND

Transistors, such as field effect transistors (FETs), may be used on the periphery of a memory device. These transistors can be located between charge pumps and the string drivers of a memory device that provide voltages to access lines (e.g., word lines) coupled to memory cells and can be used in charge pump circuitry and for the string drivers. Such transistors may be referred to as pass transistors, for example.

Some memory devices may include stacked memory arrays, e.g., often referred to as three-dimensional memory arrays. For example, a stacked memory array may include a plurality of vertical strings (e.g., NAND strings) of memory cells, e.g., coupled in series, between a source and a data line, such as a bit line. For example, the memory cells at a common location (e.g., at a common vertical level) might be commonly coupled to an access line, such as a local access line (e.g., a local word line), that may in turn be selectively coupled to a driver by a pass transistor. For example, pass transistors might couple local access lines to voltage supply circuitry, such as global access lines (e.g., global word lines).

The term vertical may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

In some stacked memory arrays, the pass transistors might be located under (e.g., at a vertical level under) the memory array. However, as the number of memory cells in the vertical strings increases, the number of local access lines may increase, and thus the number of pass transistors that might be located under the memory array may also increase. This can lead to increases in the size of the memory device in order to accommodate the increased number of pass transistors.

For the reasons stated above, and for other reasons stated below which will become apparent to those skilled in the art upon reading and understanding the present specification, there is a need in the art for alternatives to existing transistor configurations for use in memory devices with stacked memory arrays and other applications.

DETAILED DESCRIPTION

Figure 1:
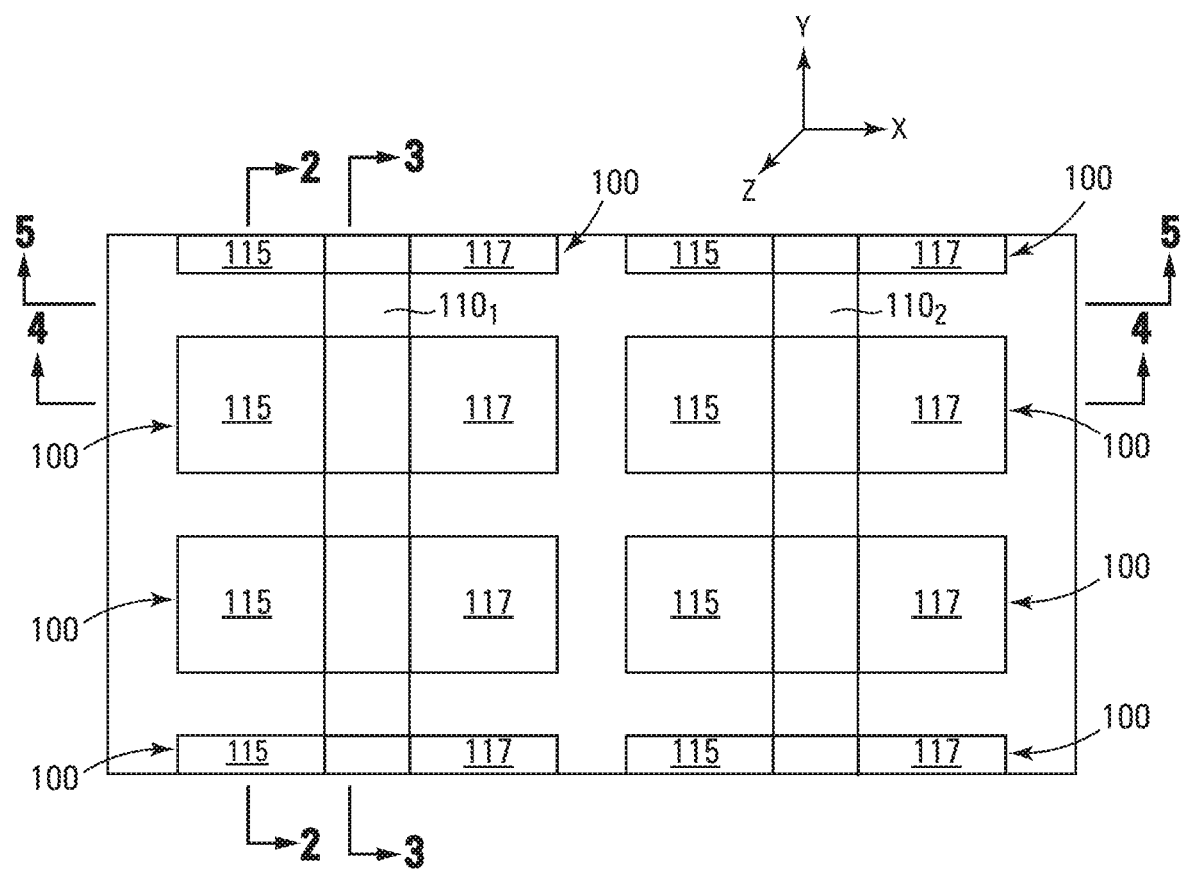
FIG. 1 is a top view of a plurality of transistors, according to the background art.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a top view (in an x-y plane) of a portion of an array of transistors, such as pass transistors, according to the background art. For example, the transistors may be field effect transistors (FETs), such as finFETs 100. For example, a plurality of finFETs 100 may be commonly coupled to a control line $110_1$, and a plurality of finFETs 100 may be commonly coupled to a control line $110_2$. Each finFET 100 may include a source/drain 115 and a source/drain 117. Note that the finFETs 100 may have a relatively high breakdown voltage (e.g., above about 15 volts to about 80 volts or greater). For example, the breakdown voltage may be defined as the voltage at which the drain (or source) breaks down while the transistor is turned off.

Figure 2:
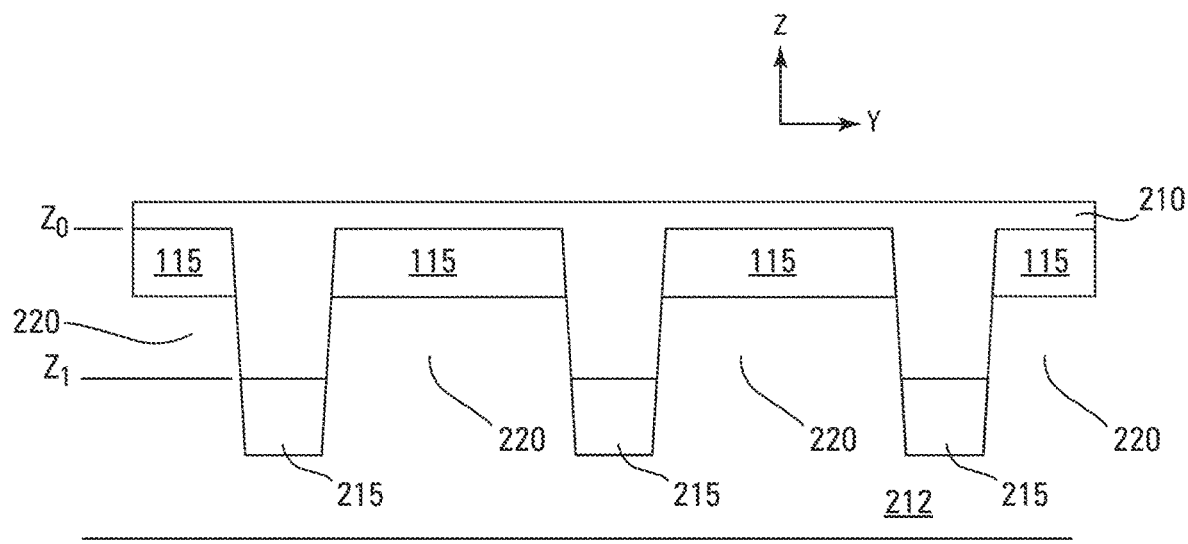
FIG. 2 is a cross-sectional view taken along line 2-2 in FIG. 1.

FIG. 2 is a cross-sectional view in a y-z plane taken along line 2-2 in FIG. 1, where cross-hatching is omitted for clarity. A dielectric 210 may be over an uppermost surface of a semiconductor 212, where the uppermost surface of semiconductor 212 may be at a vertical level (e.g., vertical elevation) $Z_0$ (e.g., $z=Z_0$). The source/drains 115 may be formed in semiconductor 212 so that their upper surfaces (e.g., uppermost surfaces) are at the vertical level of $Z_0$ so that dielectric 210 may be over the upper surfaces of source/drains 115. Note that the vertical direction (e.g., the z direction) may be perpendicular (e.g., orthogonal) to x-y plane in FIG. 1.

Portions of dielectric 210 may extend into semiconductor 212 between adjacent source/drains 115 to isolation regions 215 (e.g. field isolation regions) that are under those portions of dielectric 210. For example, portions of dielectric 210 might extend to the upper surfaces of isolation regions 215, and isolation regions 215 may extend downward below vertical level $Z_1$. These portions of dielectric 210 also provide isolation and might be portions of isolation regions 215, for example.

Semiconductor fins 220 (e.g., active regions) may be between the portions of dielectric 210 that extend to isolation regions 215. The upper (e.g., the uppermost) surfaces of isolation regions 215 may be at a vertical level $Z_1$ (e.g., $z=Z_1$) below the uppermost surface of semiconductor 212.

The uppermost surfaces of the semiconductor fins 220 may be at the vertical level $Z_0$, and thus may coincide with the uppermost surface of semiconductor 212. For example, source/drains 115 may be in semiconductor fins 220, and the upper (e.g., the uppermost) surfaces of source/drains 115 may coincide with the uppermost surfaces of semiconductor fins 220 at the vertical level of $Z_0$. Semiconductor fins 220 might extend to the upper surfaces of isolation regions 215 at the vertical level of $Z_1$, for example.

Dielectric 210 might be generally formed of one or more dielectric materials such as an oxide, e.g., silicon dioxide, a high-dielectric constant (e.g., high-K) dielectric, such as hafnium oxide, e.g., with a K of about 25, etc. Isolation regions 215 might be generally formed of one or more dielectric materials and may include for example an oxide, e.g., a field oxide and/or a high-density-plasma (HDP) oxide, or a spin-on dielectric material, e.g., hydrogen silsesquioxane (HSQ), hexamethyldisiloxane, octamethyltrisiloxane, etc. In some examples, isolation regions 215 might be silicon dioxide.

Figure 3:
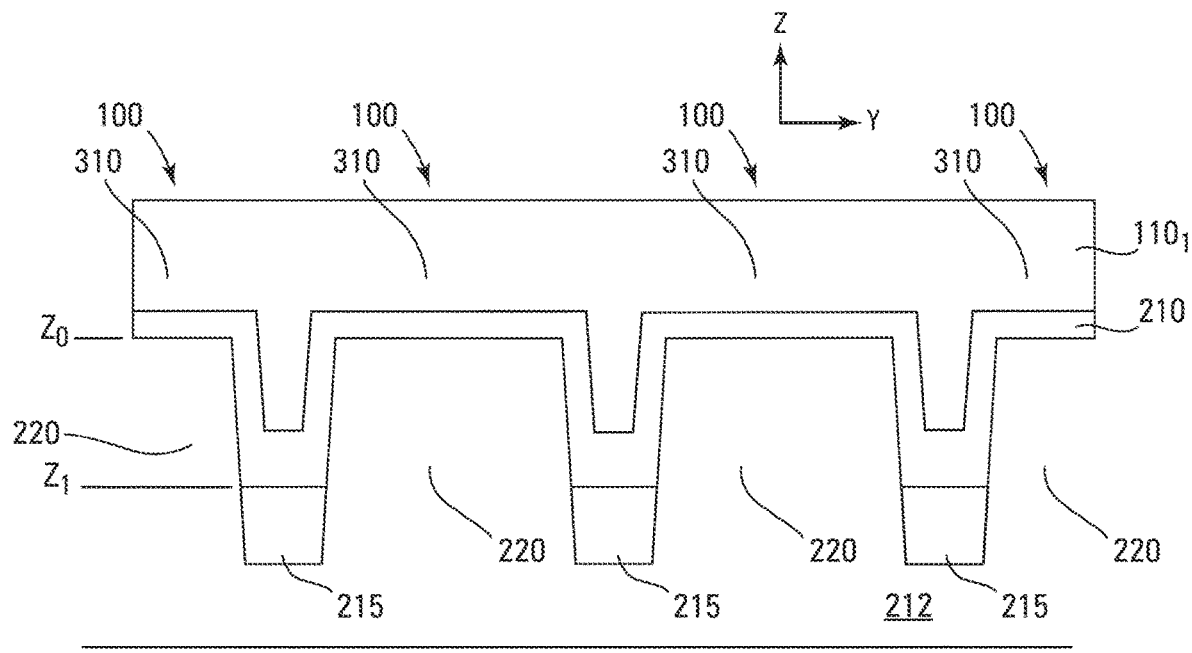
FIG. 3 is a cross-sectional view taken along line 3-3 in FIG. 1.

FIG. 3 is a cross-sectional view in a y-z plane taken along line 3-3 in FIG. 1, where cross-hatching is omitted for clarity. The control line $110_1$ may be formed over dielectric 210. Portions of control gate $110_1$ may extend into the portions of dielectric 210 that may extend to isolation regions 215. For example, those portions of control gate $110_1$ may be between adjacent semiconductor fins 220 and may extend below the upper surface of semiconductor 212 (e.g., below the vertical level $Z_0$) and below the source drains 215.

Dielectric 210 may form a gate dielectric for the finFETs 100, for example. Each finFET 100 may include a control gate 310 that may be over dielectric 210 and that may be coupled to or may form a portion of a control gate 110. For example, portions of a control gate 310 may extend below the uppermost surface of semiconductor 212, and thus the uppermost surfaces of the semiconductor fins 220, on either side of the semiconductor fins 220.

Control gates 310 and control lines $110_1$ and $110_2$ may be generally formed of one or more conductors. For example, control gates 310 and control lines $110_1$ and $110_2$ may be formed of one or more conductive materials and may comprise, consist of, or consist essentially of conductively doped polysilicon and/or may comprise, consist of, or consist essentially of metal, such as a refractory metal, aluminum, copper, etc., or a metal-containing material, such as a refractory metal silicide layer, as well as other conductive materials. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals.

Figure 4:
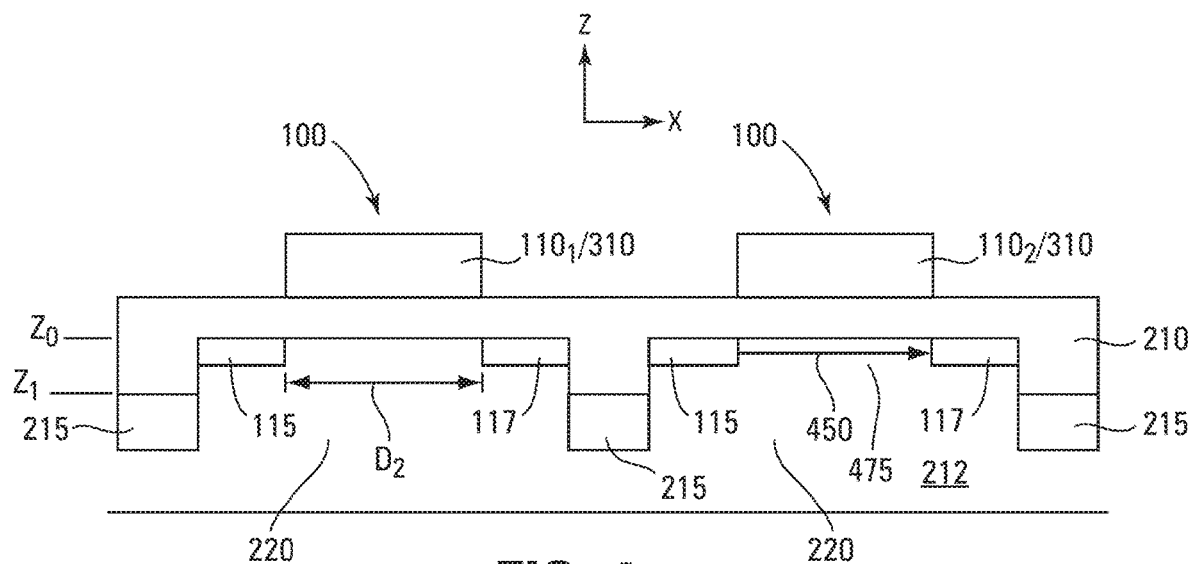
FIG. 4 is a cross-sectional view taken along line 4-4 in FIG. 1.

FIG. 4 is a cross-sectional view in an x-z plane taken along line 4-4 in FIG. 1, where cross-hatching is omitted for clarity. FIG. 4 illustrates a finFET 100 coupled to control line $110_1$ over a semiconductor fin 220 and a finFET 100 coupled to control line $110_2$ over an adjacent semiconductor fin 220. The finFETs 100 in FIG. 4 may be isolated from each other by an isolation region 215, for example. The portions of dielectric 210 that extend to isolation regions 215 in FIG. 4 may also provide isolation, for example. In some examples, these portions of dielectric 210 might form portions of isolation regions 215. In some examples, dielectric 210 may be a common gate dielectric to the finFET 100 coupled to control line $110_1$ and the finFET 100 coupled to control line $110_2$, as shown in FIG. 4. Note that the upper surfaces of the source/drains 115 and 117 of finFETs 100 coincide with uppermost surfaces of the semiconductor fins 220.

Figure 5:
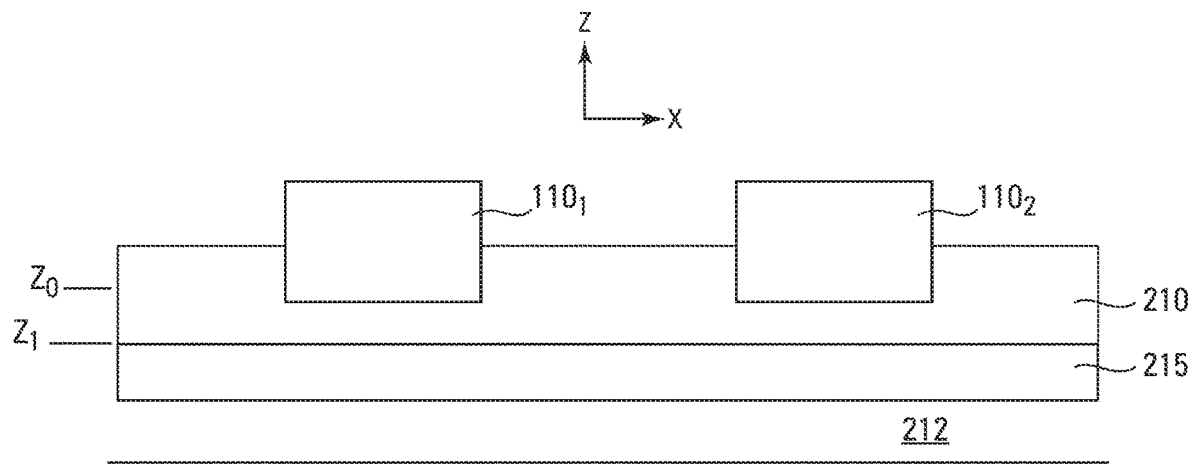
FIG. 5 is a cross-sectional view taken along line 5-5 in FIG. 1.

FIG. 5 is a cross-sectional view taken in an x-z plane along line 5-5 in FIG. 1, where cross-hatching is omitted for clarity. The example cross-section of FIG. 5 shows dielectric 210 extending below the vertical level $Z_0$ to an isolation region 215 (e.g., to vertical level $Z_1$), and the control lines $110_1$ and $110_2$ extending below the vertical level $Z_0$ and into the dielectric 210.

Figure 6:
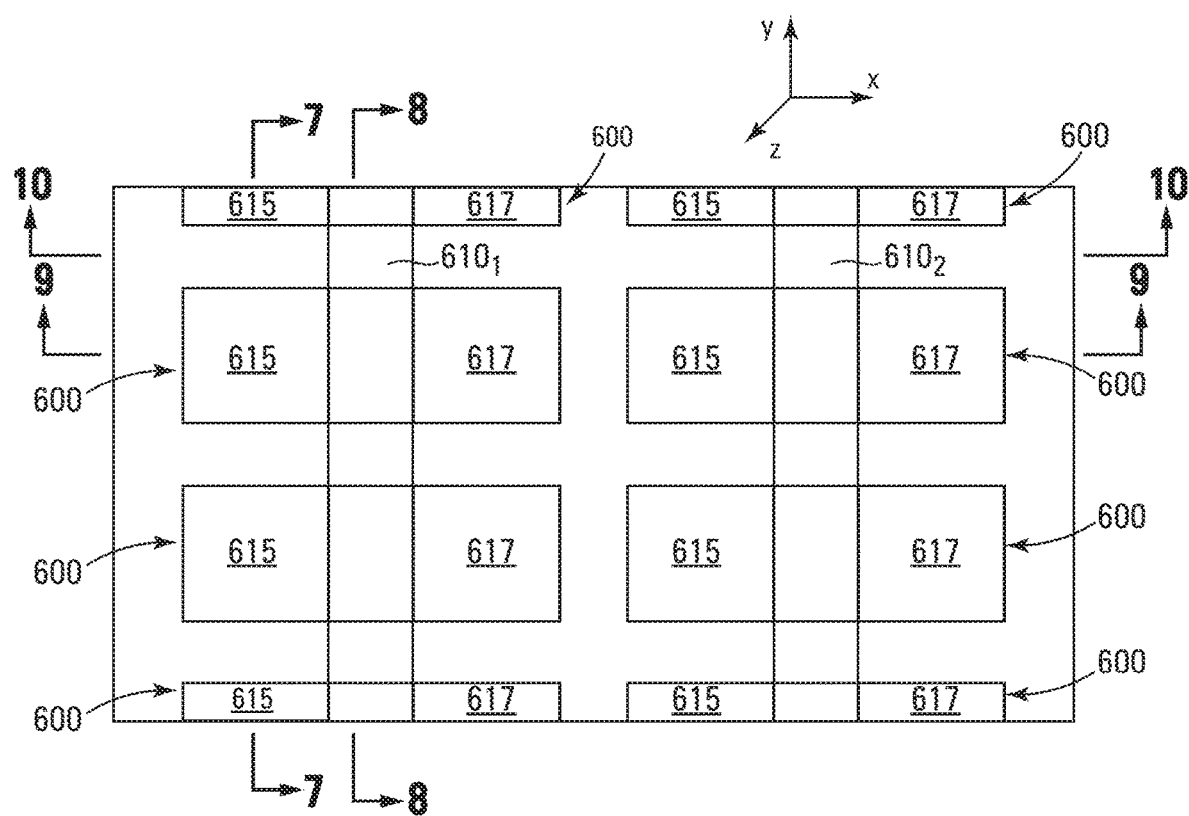
FIG. 6 is a top view of a plurality of transistors, according to an embodiment.

FIG. 6 is a top view (e.g., in an x-y plane) of a portion of an array of transistors, such as pass transistors, according to an embodiment. For example, the transistors may be field effect transistors (FETs), such as finFETs 600. For example, a plurality of finFETs 600 may be commonly coupled to a control line $610_1$, and a plurality of finFETs 600 may be commonly coupled to a control line $610_2$. Each finFET 600 may include a source/drain 615 and a source/drain 617. Note that the finFETs 600 may have a relatively high breakdown voltage (e.g., above about 15 volts to about 80 volts or greater).

Figure 7:
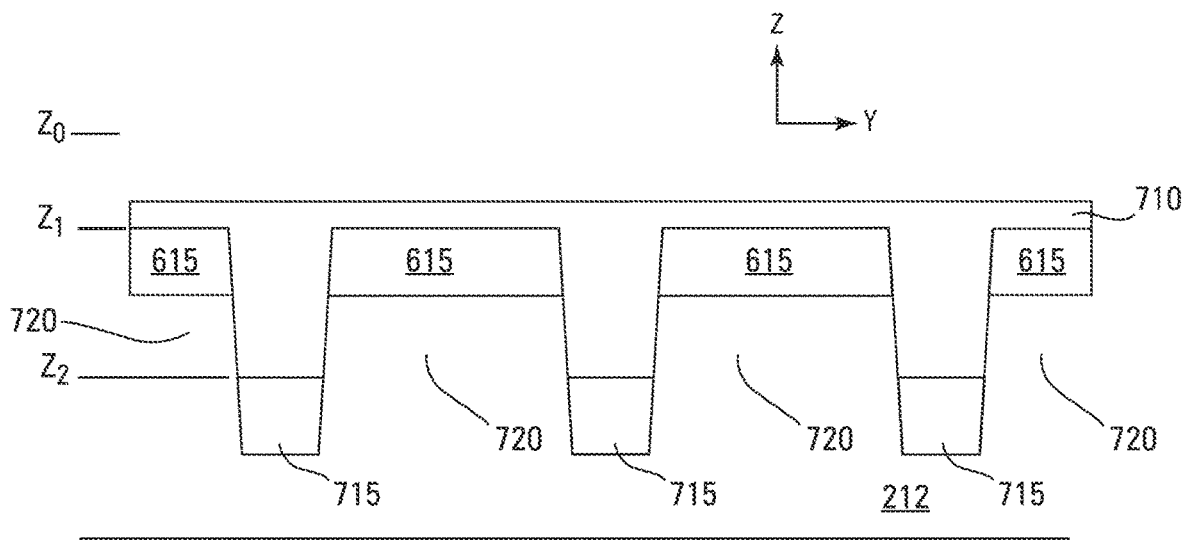
FIG. 7 is a cross-sectional view taken along line 7-7 in FIG. 6.

FIG. 7 is a cross-sectional view in a y-z plane taken along line 7-7 in FIG. 6, where cross-hatching is omitted for clarity. Note that the cross-section in FIG. 7 corresponds to the cross-section in FIG. 2. Note that the vertical direction (e.g., the z direction) may be perpendicular to the x-y plane in FIG. 6.

A dielectric 710 may be over a surface in semiconductor 212 that is at a vertical level $Z_1$ in semiconductor 212 and that is below the uppermost surface (e.g., at the vertical level $Z_0$) of semiconductor 212. An uppermost surface of dielectric 710 may be below the uppermost surface of semiconductor 212 for some embodiments.

The source/drains 615 may be formed in semiconductor 212 so that their upper surfaces (e.g., uppermost surfaces) are at the vertical level $Z_1$, where dielectric 710 may be over the upper surfaces of source/drains 615. Note that the upper surfaces of the source/drains 615 of finFETS 600 may be at a vertical level that is below the vertical level of the uppermost surface of semiconductor 212 so that the upper surfaces of source/drains 615 may be at a vertical level below the vertical level of the upper surfaces of source/drains 115 in FIG. 2, which may be at the vertical level of the uppermost surface of semiconductor 212, and thus of the finFETS 100 in FIG. 2.

Portions of dielectric 710 may extend into semiconductor 212 between adjacent source/drains 615 to isolation regions 715 that are under those portions of dielectric 710. For example, upper surfaces of isolation regions 715 may at a vertical level $Z_2$ (e.g., $z=Z_2$) in semiconductor 212 so that isolation regions 715 may extend downward from vertical level $Z_2$. The portions of dielectric 710 that might extend into semiconductor 212 between adjacent source/drains 615 to isolation regions 715 may also provide isolation. For example, for some embodiments, these portions of dielectric 710 might be portions of isolation regions 715.

Source/drains 615 may be located in the lower portions of semiconductor fins 720. For example, the lower portions of semiconductor fins 720 may extend from the vertical level $Z_1$ to the vertical level $Z_2$.

Dielectric 710 might be generally formed of one or more dielectric materials such as an oxide, e.g., silicon dioxide, a high-dielectric constant (e.g., high-K) dielectric, such as hafnium oxide, e.g., with a K of about 25, etc. Isolation regions 715 might be generally formed of one or more dielectric materials and may include for example an oxide, e.g., a field oxide and/or a high-density-plasma (HDP) oxide, or a spin-on dielectric material, e.g., hydrogen silsesquioxane (HSQ), hexamethyldisiloxane, octamethyltrisiloxane, etc. Isolation regions 715 might be silicon dioxide or hafnium oxide, for example.

Figure 8:
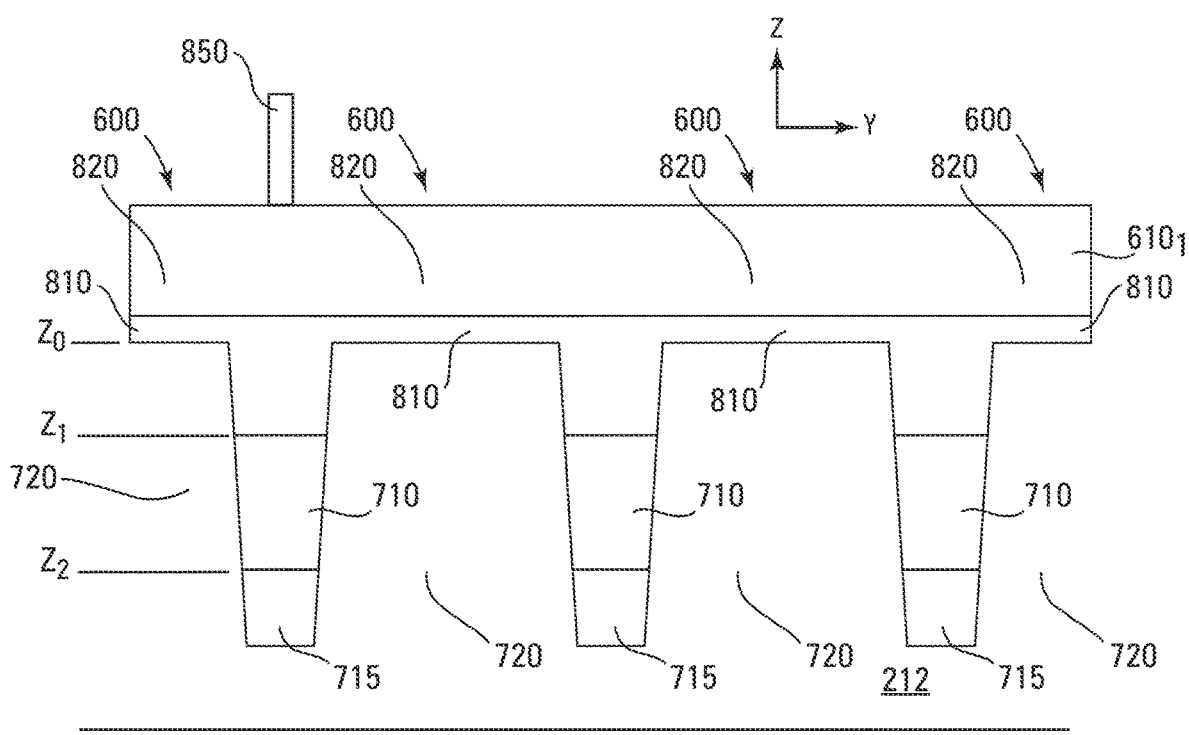
FIG. 8 is a cross-sectional view taken along line 8-8 in FIG. 6.
Figure 9:
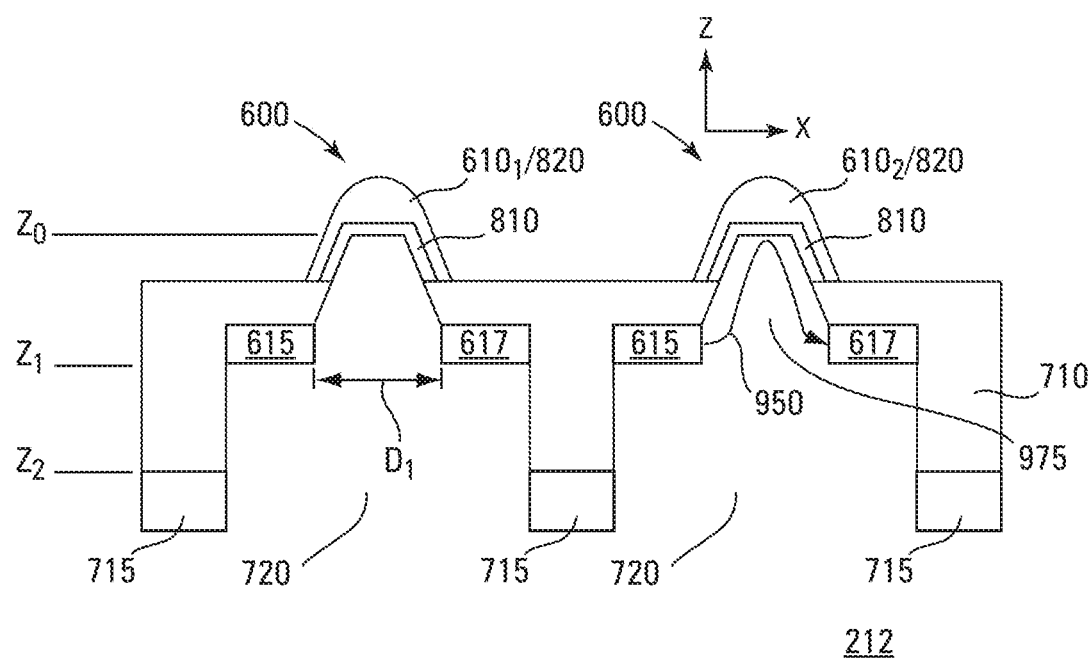
FIG. 9 is a cross-sectional view taken along line 9-9 in FIG. 6.

FIG. 8 is a cross-sectional view in a y-z plane taken along line 8-8 in FIG. 6, and FIG. 9 is a cross-sectional view in an x-z plane taken along line 9-9 in FIG. 6, where crosshatching is omitted in FIGS. 8 and 9 for clarity. Note that the cross-section in FIG. 8 corresponds to the cross-section in FIG. 3, and the cross-section in FIG. 9 corresponds to the cross-section in FIG. 4.

FIGS. 8 and 9 show that the semiconductor fins 720 may extend from the vertical level $Z_0$ of the uppermost surface of semiconductor 212 to the vertical level $Z_2$, where the uppermost surfaces of semiconductor fins 720 may be coincident with the upper surface of semiconductor 212 for some embodiments. Note that the upper surfaces of the source/drains 615 may be at the vertical level $Z_1$ that is below the vertical level $Z_0$ of the uppermost surfaces of semiconductor fins 720, so that the upper surfaces of the source/drains 615 may be between the uppermost surfaces of semiconductor fins 720 and the upper surfaces of isolation regions 715, for example.

The vertical level $Z_2$ might be the lowermost level of a semiconductor fin 720, for example. That is, isolation regions 715 may extend downward from the vertical level $Z_2$, for example, so that upper (e.g., uppermost) surfaces of isolation regions 715 may be at the vertical level $Z_2$. For some embodiments, the isolation regions 715 shown in FIG. 8 might include the portions of dielectric 710 in FIG. 8.

A dielectric 810 may form a gate dielectric for the finFETs 600. Each finFET 600 may include a control gate 820 that may be over dielectric 810 and that may be coupled to or may form a portion of a control line 610. For some embodiments, dielectric 810 might extend downward on either side of semiconductor fins 720, e.g., adjacent to the sidewalls of semiconductor fins 720, to upper surfaces of dielectric 710. A control gate 820 may extend downward on either side of a semiconductor fin 720 to upper surfaces of dielectric 710, for example.

A contact, such as a gate contact 850, might be coupled to control line $610_1$. For example, gate contact 850 might be vertically aligned with an isolation region 715, as shown in FIG. 8.

A comparison FIGS. 3 and 8 shows that the control line $610_1$ does not extend vertically downward between the source/drains 615 of the finFETs 600 commonly coupled to control line $610_1$ as control line $110_1$ extends vertically downward between the source/drains 115 of the finFETs 100 commonly coupled to control line $110_1$.

Control gates 820 and control lines $610_1$ and $610_2$ may be generally formed of one or more conductors. For example, control gates 820 and control lines $610_1$ and $610_2$ may be formed of one or more conductive materials and may comprise, consist of, or consist essentially of conductively doped polysilicon and/or may comprise, consist of, or consist essentially of metal, such as a refractory metal, aluminum, copper, etc., or a metal-containing material, such as a refractory metal silicide layer, as well as other conductive materials. Dielectric 810 might be generally formed of one or more dielectric materials such as an oxide, e.g., silicon dioxide, a high-dielectric constant (e.g., high-K) dielectric, such as hafnium oxide, e.g., with a K of about 25, etc. Gate contact 850 may be generally formed from one or more conductors. For example, the one or more conductors may comprise, consist of, or consist essentially of a metal or a metal-containing material and might be aluminum, copper, a refractory metal, or a refractory metal silicide.

FIG. 9 illustrates a finFET 600 coupled to control line $610_1$ over a semiconductor fin 720 and a finFET 600 coupled to control line $610_2$ over an adjacent semiconductor fin 720. The finFETs 100 in FIG. 9 may be isolated from each other by an isolation region 715, for example. For some embodiments, the isolation regions 715 in FIG. 9 might include the portions of dielectric 710 that are shown extending to isolation regions 715 in FIG. 9. That is, these portions of dielectric 710 may provide isolation, for example.

The uppermost surfaces of semiconductor fins 720 may be at the vertical level $Z_0$ and thus may be at the vertical level of the uppermost surface of semiconductor 212. The source/drains 615 and 617 of the finFETs 600 may be in semiconductor fins 720 and may be below the uppermost surface of semiconductor fins 720. For example, the upper surfaces of source/drains 615 and 617 of finFETs 600 may be at the vertical level $Z_1$ that is vertically below the uppermost surfaces of semiconductor fins 720. That is, for example, the upper surfaces of source/drains 615 and 617 may be coincident with surfaces of a semiconductor fin 720 that are at the vertical level $Z_1$. In contrast, the upper surfaces of source/drains 115 and 117 of finFETs 100 in FIG. 4 may be at the vertical level $Z_0$ that is at the vertical level of the uppermost surfaces of semiconductor fins 220.

Dielectric 710 might extend to a vertical level below the upper surfaces of source/drains 615 and 617 on either side of semiconductor fins 720, for example, to isolation regions 715. That is, dielectric 710 might extend to vertical level $Z_2$, for example, and might provide isolation.

Dielectric 710 may between the upper surfaces of source/drains 615 and 617 and terminal ends of control gate 820 and terminal ends of dielectric 810, for example. For example, control gate 820 and dielectric 810 might terminate at an upper surface of dielectric 710, and the upper surface of dielectric 710 might be at a vertical level above the vertical level of the upper surfaces of source/drains 615 and 617 and below the vertical level of the uppermost surface of a semiconductor fin 720. That is, the upper surface of dielectric 710 may be at a vertical level between the vertical levels $Z_1$ and $Z_0$.

Positioning the source/drains 615 and 617 of finFETs 600 so that they are below the uppermost surface of a semiconductor fin 720 of a finFET 600 allows the distance D1 in the x-direction between source/drains 615 and 617 to be less than the distance D2 in the x-direction between the source/drains 115 and 117 of a finFET 100 (FIG. 4). The decreased distance allows for more finFETs in the x-direction, e.g., under a stacked memory array to accommodate for more memory cells in a stack of memory cells.

Figure 10:
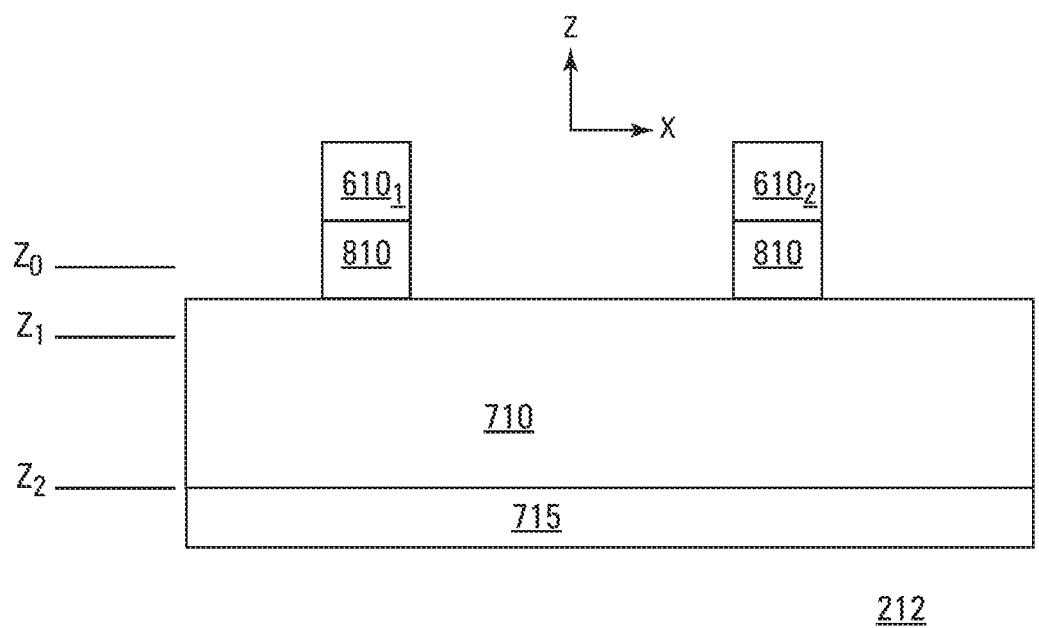
FIG. 10 is a cross-sectional view taken along line 10-10 in FIG. 6.

FIG. 10 is a cross-sectional view taken in an x-z plane along line 10-10 in FIG. 6, where cross-hatching is omitted for clarity. The example cross-section of FIG. 10 shows dielectric 710 extending below the vertical level $Z_1$ to an upper surface of an isolation region 715 at the vertical level $Z_2$.

An arrow 450 in FIG. 4 illustrates the current path in an activated finFET 100. As shown, the current may generally follow a straight-line path as it flows from source/drain 115 to source/drain 117 in semiconductor fin 220. For example, the current path between source/drain 115 to source/drain 117 may be generally parallel to the uppermost surface of a semiconductor fin 220. For example, the current path between source/drain 115 to source/drain 117 may be generally horizontal.

For example, a channel 475 may be formed between source/drain 115 and source/drain 117 when finFET 100 is activated, and the current may flow in channel 475. Semiconductor fin 220 may extend in the x-direction, and thus may extend in a direction that is generally parallel to channel 475 and thus the direction of the current flow. For example, semiconductor fin 220 may extend in a direction that is perpendicular to the face plane of FIG. 3 between and generally parallel to the portions of a control gate 310 that may extend below the uppermost surfaces of the semiconductor fins 220 on either side of the semiconductor fins 220, as shown in FIG. 3. That is, semiconductor fin 220 may extend in a direction from source/drain 115 to source/drain 117, for example.

In contrast, an arrow 950 in FIG. 9 shows that the current may generally follow a curved path (e.g., a convex curve) as it flows from source/drain 615 to source/drain 617 in the semiconductor fin 720 of an activated finFET 600. For example, the current flow may have an upward trajectory and a downward trajectory, e.g., a vertical upward component and a vertical downward component, and may change direction in semiconductor fin 720.

Note that a channel 975 may formed in the portion of semiconductor fin 720 that is above the upper surfaces source/drains 615 and 617 when finFET 600 is activated. For example, finFET 600 may include a channel 975 (e.g., a convex channel) that extends to a vertical location above the upper surfaces of source/drains 615 and 617. For example, channel 975 may be convex relative to (e.g., when viewed from) the uppermost surface of semiconductor fin 720.

Semiconductor fin 720 may extend in the y-direction, for example, and thus may extend in a direction that is generally perpendicular (e.g., orthogonal) to channel 975 and thus the direction of the current flow. For example, semiconductor fin 720 may extend in the y-direction that is perpendicular to the face plane of FIG. 9. That is, semiconductor fin 720 may extend in a direction that is perpendicular to a direction from source/drain 615 to source/drain 617, for example.

Figure 11A:
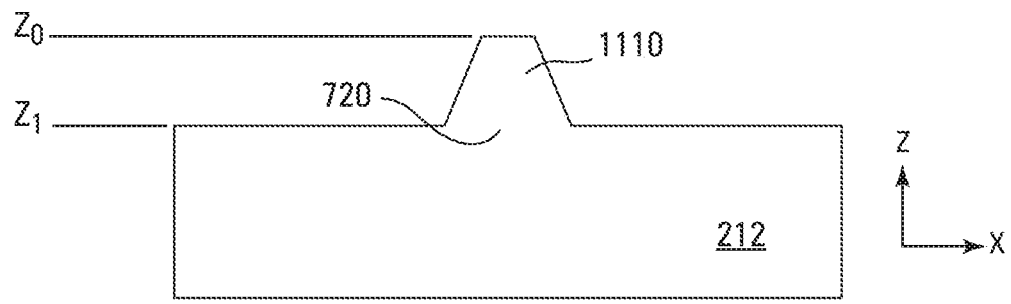
FIGS. 11A-11F are cross-sectional views of a transistor during various stages of fabrication, according to an embodiment.

FIGS. 11A-11F are cross-sectional views, e.g., in the x-z plane, of a finFET transistor 600 during various stages of fabrication. In FIG. 11A, an upper portion 1110 of a semiconductor fin 720 may be formed by patterning the uppermost surface of semiconductor 212 (e.g., at vertical level $Z_0$) and removing portions of semiconductor 212 exposed by the pattern. For example, a mask (not shown), e.g., imaging resist, such as photo-resist, may be formed over the uppermost surface of semiconductor 212 and patterned to define regions of semiconductor 212 for removal. The regions defined for removal are subsequently removed, e.g., by etching, stopping at the vertical level $Z_1$ and leaving the upper portion 1110 of semiconductor fin 720 that is under the mask.

Figure 11B:
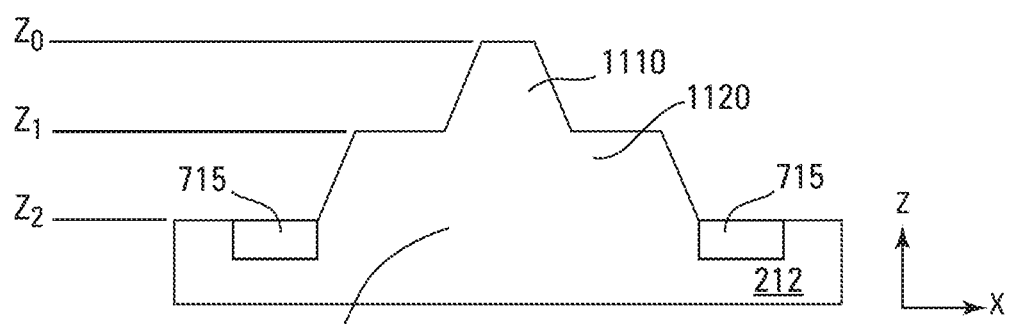

In FIG. 11B, a lower portion 1120 of semiconductor fin 720 may be formed by patterning the exposed surfaces of the upper portion 1110 of semiconductor fin 720 and portions of the exposed surface of semiconductor 212 at the vertical level $Z_1$ and removing portions of semiconductor 212 exposed by the pattern. For example, a mask (not shown), e.g., imaging resist, such as photo-resist, may be formed over the exposed surfaces of the upper portion 1110 of semiconductor fin 720 and portions of the exposed surface of semiconductor 212 at the vertical level $Z_1$ for removal. The regions defined for removal are subsequently removed, e.g., by etching, stopping at the vertical level $Z_2$ and leaving the upper portion 1110 and the lower portion 1120 of semiconductor fin 720 that are under the mask. Note that the upper portion 1110 and the lower portion 1120 may be contiguous.

For some embodiments, the isolation regions 715 may be formed in semiconductor 212 to extend vertically downward from the surface of semiconductor 212 at the vertical level $Z_2$ so that an upper surface (e.g., an uppermost surface) of isolation regions 715 is at the vertical level $Z_2$. For example, isolations regions 715 may be implanted in semiconductor 212, e.g., by implanting oxygen to form silicon dioxide.

Figure 11C:
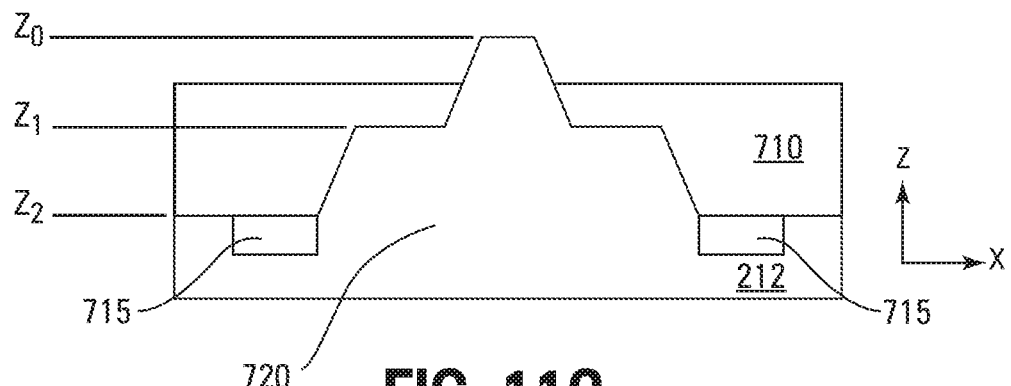

Dielectric 710 may be formed over the exposed surfaces of semiconductor 212 and of semiconductor fin 720 in FIG. 11C. For example, dielectric 710 may be formed over the exposed surface of semiconductor 212 at the vertical level $Z_2$, over the exposed surface of semiconductor fin 720 at the vertical level $Z_1$, and over a portion of the exposed surface of semiconductor fin 720 that is between the vertical level $Z_1$ and the vertical level $Z_0$.

For example, the dielectric material of dielectric 710 may be deposited (e.g., blanket deposited) to the level of or above the level of vertical level $Z_0$ and subsequently removed (e.g., partially removed) to the vertical level between the vertical level $Z_1$ and the vertical level $Z_0$. In an alternative example, the exposed portion of semiconductor fin 720 in FIG. 11C may be covered by a mask, and the dielectric material of dielectric 710 may be deposited to the vertical level between the vertical level $Z_1$ and the vertical level $Z_0$, as shown in FIG. 11C.

Figure 11D:
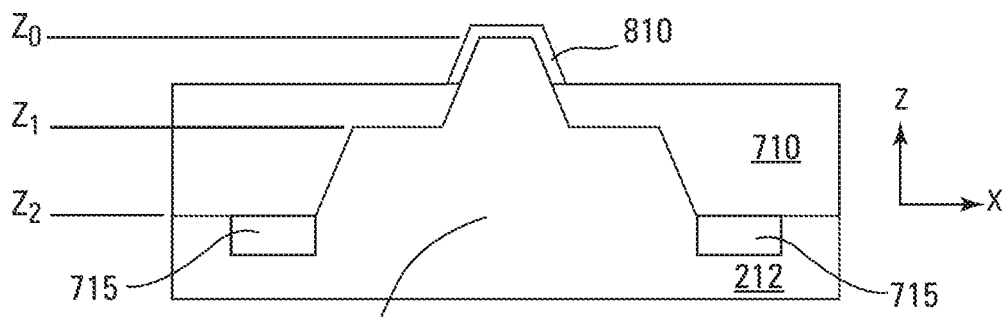

Dielectric 810 may be formed in FIG. 11D over the exposed surfaces of semiconductor fin 720 shown in FIG. 11C and a portion of the exposed upper surface of dielectric 710 shown in FIG. 11C. For example, the dielectric material of dielectric 810 may be formed over the exposed upper surface of dielectric 710 and the exposed surfaces of semiconductor fin 720. The dielectric material of dielectric 810 may then be subsequently removed so that dielectric 810 is over a portion of the upper surface of dielectric 710, over the side surfaces of semiconductor fin 720 between the upper surface of dielectric 710 and the uppermost surface of semiconductor fin 720 at vertical level $Z_0$, and over the uppermost (e.g., the top) surface of semiconductor fin 720 at vertical level $Z_0$, as shown in FIG. 11D. In an alternative example, the portions of semiconductor fin 720 and the portions of dielectric 710 uncovered by dielectric 810 in FIG. 11D may be covered, e.g., by a mask, while the dielectric material of dielectric 810 is deposited to form dielectric 810.

Figure 11E:
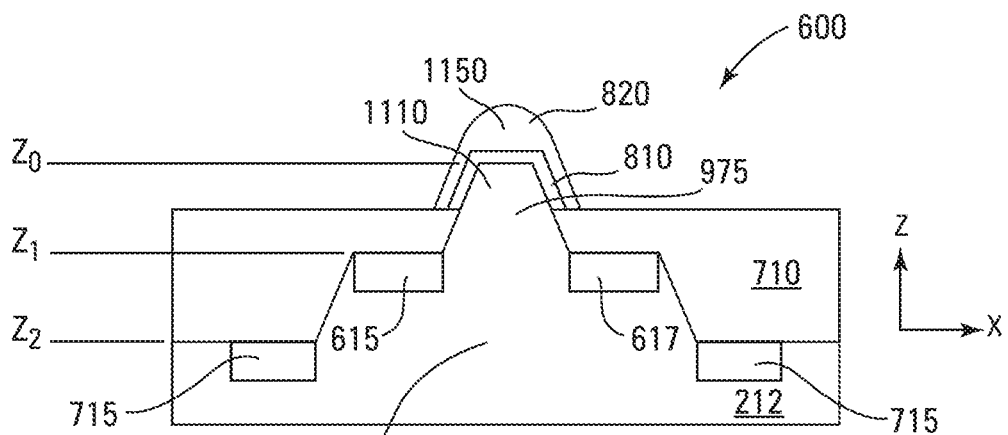

In FIG. 11E, a control gate 820 is formed over dielectric 810 from a conductor 1150. For example, 1150 may be formed over the exposed upper surface of dielectric 710 and the exposed surfaces of dielectric 810. Conductor 1150 may then be subsequently removed so that control gate 820 is over a portion of the upper surface of dielectric 710, over dielectric 810, and thus over the uppermost (e.g., the top) surface of semiconductor fin 720 at vertical level $Z_0$, as shown in FIG. 11E. In an alternative example, the portions of dielectric 810 and the portions of dielectric 710 uncovered by control gate 820 in FIG. 11E may be covered, e.g., by a mask, while conductor 1150 is deposited to form control gate 820.

Subsequently, for some embodiments, source/drain 615 and source/drain 617 may be formed in semiconductor fin 720 so that the upper (e.g., the uppermost) surfaces of source/drain 615 and source/drain 617 are at the vertical level $Z_1$ below the uppermost surface of semiconductor fin 720 at the vertical level $Z_0$. For example, the upper surfaces of source/drain 615 and source/drain 617 may be coincident with surfaces of semiconductor fin 720 that are at the vertical level $Z_1$ such that source/drain 615 and source/drain 617 do not extend above those surfaces of semiconductor fin 720.

Source/drain 615 and source/drain 617 may be formed by implanting a conductive material into semiconductor fin 720 after the formation of control gate 820, for example. For some embodiments, control gate 820 might function as a mask during the implantation of source/drains 615 and 617. Alternatively, a protective material, such as a hard mask (e.g., an oxide and/or a nitride) might cover control gate 820 during the implantation of source/drains 615 and 617.

A finFET 600 formed in FIGS. 11A-11E may include the semiconductor fin 720. Dielectric 810 may form the gate dielectric of the finFET 600 and may be over portions of semiconductor fin 720, including the uppermost surface of semiconductor fin 720, that are at vertical levels above the vertical level, e.g., the vertical level $Z_1$, of the upper surfaces of the source/drains 615 and 617 of the finFET 600. For example, dielectric 810 might wrap around those portions of semiconductor fin 720. Dielectric 810 may extend downward over (e.g., adjacent to) sidewalls of semiconductor fin 720 and may terminate at a vertical level above the vertical level $Z_1$, for example. Dielectric 810 may terminate at an upper surface of dielectric 710 so that a portion of dielectric 710 is between the upper surfaces of source/drains 615 and 617 and the (e.g., lowermost) ends of dielectric 810, for example.

The control gate 820 of the finFET 600 may be over dielectric 810. For example, control gate 820 might be confined to vertical levels above the vertical level of the upper surfaces of the source/drains 615 and 617. That is, control gate 820 may extend downward on either side of semiconductor fin 720 and may terminate at a vertical level above the vertical level $Z_1$, for example. Control gate 820 may terminate at an upper surface of dielectric 710 so that a portion of dielectric 710 is between the upper surfaces of source/drains 615 and 617 and the (e.g., lowermost) ends of control gate 820, for example.

A channel 975 may be in the upper portion 1110 of semiconductor fin 720. For example, channel 975 may extend above the upper surfaces of source/drains 615 and 617.

Figure 11F:
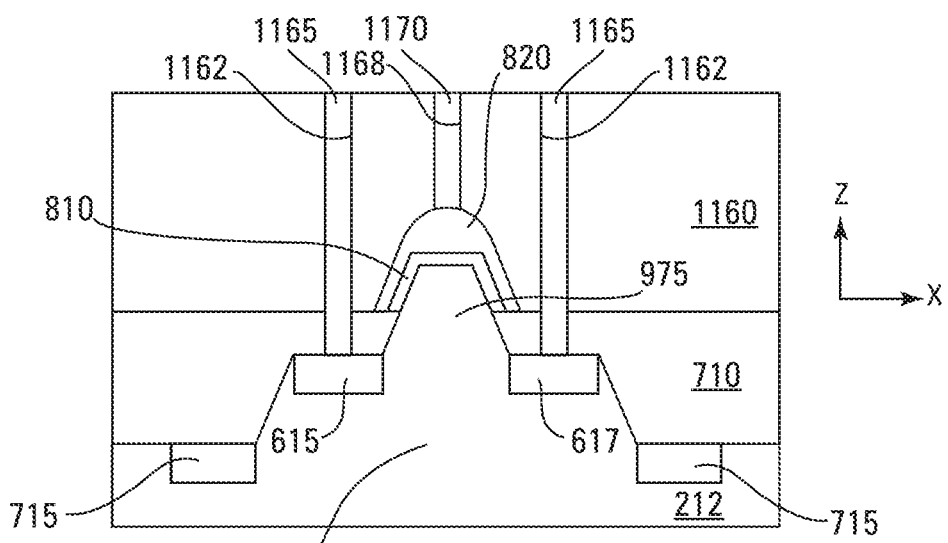

A dielectric 1160, e.g., a bulk dielectric, may then be formed over dielectric 710 and control gate 820, as shown in FIG. 11F. One example for dielectric 1160 would be a doped silicate glass. Examples of doped silicate glasses include BSG (borosilicate glass), PSG (phosphosilicate glass), and BPSG (borophosphosilicate glass). Another example for dielectric 1160 would be TEOS (tetraethylorthosilicate), silicon dioxide, etc.

A mask (not shown) may be formed over dielectric 1160 and patterned to expose portions of dielectric 1160 directly over (e.g., vertically aligned with) source/drains 615 and 617 and control gate 820 for removal. The exposed portions of dielectric 1160 directly over source/drains 615 and 617 may then be removed, such as by etching, stopping on or within source/drains 615 and 617 to form openings 1162 that expose source/drains 615 and 617. The exposed portions of dielectric 1160 directly over control gate 820 may be removed, such as by etching, stopping on or within control gate 820 to form an opening 1168 that exposes control gate 820. The mask may then be removed, and contacts, such as source/drain contacts 1165, may then be formed in the openings 1162, e.g., in direct physical contact with source/drains 615 and 617, and a contact, such as a gate contact 1170, may be formed in opening 1168, e.g., in direct physical contact with control gate 820.

Contacts 1165 and 1170 may be generally formed from one or more conductors. For example, the one or more conductors may comprise, consist of, or consist essentially of a metal or a metal-containing material and might be aluminum, copper, a refractory metal, or a refractory metal silicide.

FIGS. 12A-12D are cross-sectional views, e.g., in the x-z plane, of a transistor 1200 (FIG. 12C), such as a field effect transistor, during various stages of fabrication. Note that the transistor 1200 may have a relatively high breakdown voltage (e.g., above about 15 volts to about 80 volts or greater). For example, transistor 1200 may be a pass transistor, e.g., coupled between an access-line driver and an access line commonly coupled to a plurality of memory cells in a memory array, such as a stacked memory array.

Figure 12A:
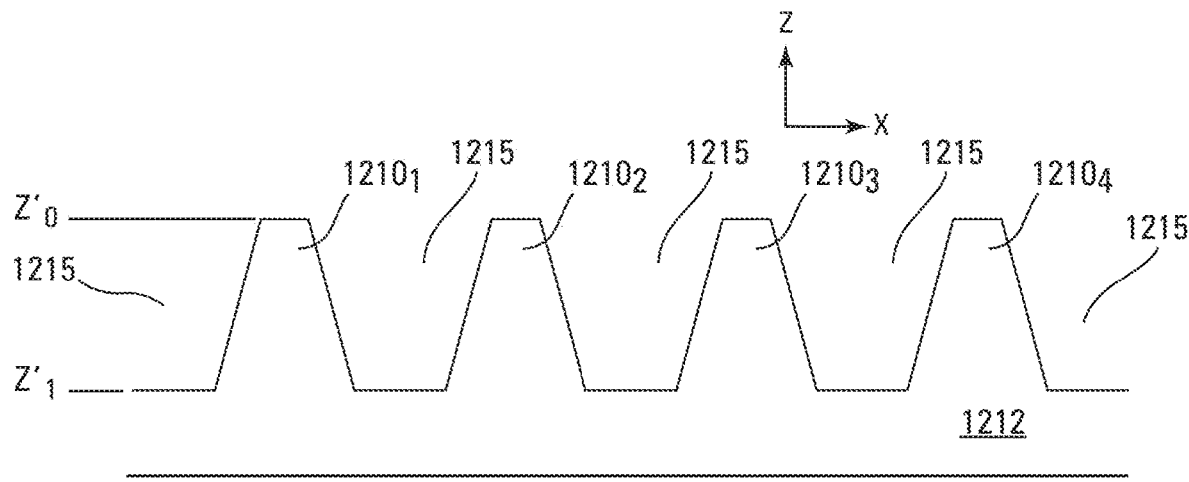
FIGS. 12A-12D are cross-sectional views of a transistor during various stages of fabrication, according to another embodiment.

In FIG. 12A, a plurality of semiconductor fins (e.g., pillars) 1210, such as semiconductor fins $1210_1$ to $1210_4$, may be formed by patterning the uppermost surface (e.g., at vertical level $z=Z_0'$) of a semiconductor 1212 and removing portions of semiconductor 1212 exposed by the pattern. For example, a mask (not shown), e.g., imaging resist, such as photo-resist, may be formed over the uppermost surface of semiconductor 1212 and patterned to define regions of semiconductor 1212 for removal. The regions defined for removal may be subsequently removed, e.g., by etching, stopping at a vertical level $z=Z_1'$ and leaving semiconductor fins 1210 under the mask and forming openings 1215, where semiconductor 1212 was removed, between the semiconductor fins 1210. Uppermost surfaces of semiconductor fins 1210 may be at vertical level $Z_0'$, e.g., coincident with the uppermost surface of semiconductor 1212, for example. Note that semiconductor 1212 might be conductively doped, e.g., to have a p-type conductivity.

Figure 12B:
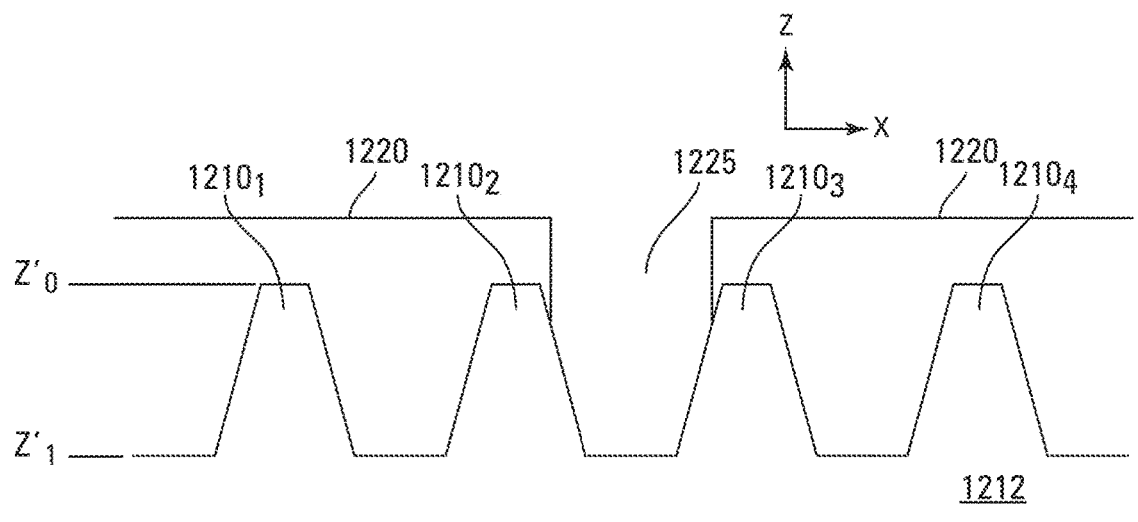

A dielectric 1220 may then be formed over the structure of FIG. 12A, e.g., over semiconductor fins 1210 and in the openings 1215 between the semiconductor fins 1210. Dielectric 1220 may then be patterned to define a portion of dielectric 1220, extending into the opening 1215 between semiconductor fins $1210_2$ and $1210_3$ for removal. The portion of dielectric may then be removed, e.g., by etching, as shown in FIG. 12B to form an opening 1225 through dielectric 1220 that exposes a portion, e.g., a surfaces, of semiconductor $1212$, where opening $1225$ may extend to vertical level $Z_1'$. Dielectric $1220$ might be generally formed of one or more dielectric materials such as an oxide, e.g., silicon dioxide, a high-dielectric constant (e.g., high-K) dielectric, such as hafnium oxide, e.g., with a K of about 25, etc.

Figure 12C:
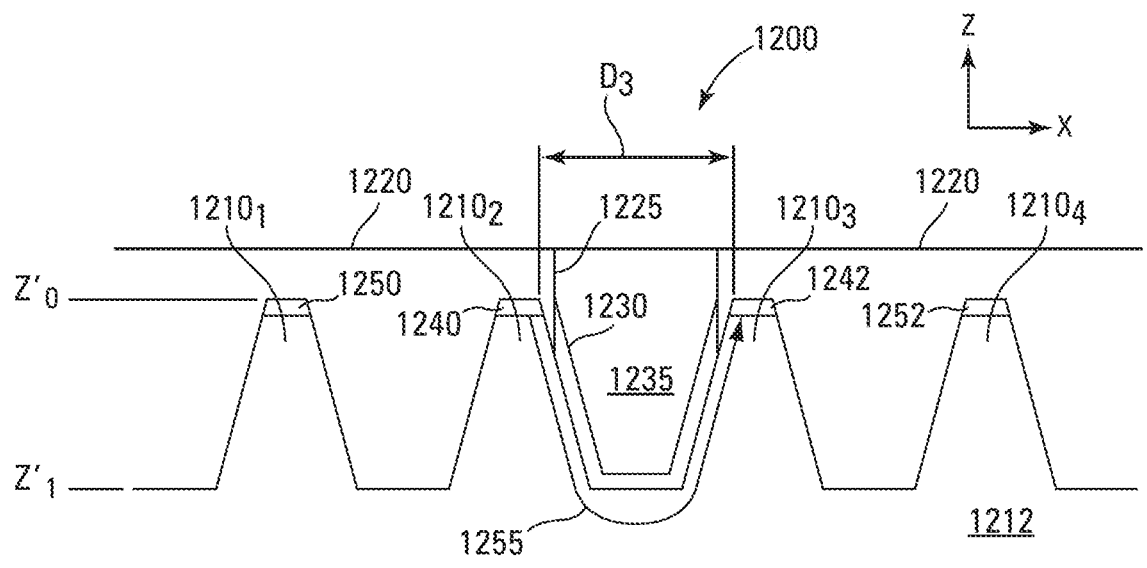

A dielectric $1230$ may then be formed in opening $1225$, e.g., on the exposed surfaces of semiconductor $1212$ and on at least a portion of dielectric $1220$ in opening $1225$, as shown in FIG. 12C. For example, portions of dielectric $1230$ may be respectively adjacent to (e.g., in direct contact with) sidewalls of semiconductor fins $1210_2$ and $1210_3$. Another portion of dielectric $1230$, e.g., between and contiguous to the portions of dielectric $1230$ that may be respectively adjacent to the sidewalls of semiconductor fins $1210_2$ and $1210_3$, may be over (e.g., in direct contact with) the bottom surface (e.g., at vertical level $Z_1'$) of opening $1225$, for example. Upper ends (e.g., uppermost ends) of dielectric $1230$ may be below the uppermost surfaces of semiconductor fins $1210$, for example.

Dielectric $1230$ may be generally formed of one or more dielectric materials such as an oxide, e.g., silicon dioxide, a high-dielectric constant (e.g., high-K) dielectric, such as hafnium oxide, e.g., with a K of about 25, etc. For example, dielectric $1230$ might be an oxide that may be grown on the exposed surfaces of semiconductor $1212$ and portions of dielectric $1220$ within opening $1225$.

A control gate $1235$ of transistor $1200$ may then be formed in opening $1225$, as shown in FIG. 12C. Dielectric $1230$ may form the gate dielectric of transistor $1200$. Control gate $1235$ may be generally formed of one or more conductors. For example, control gate $1235$ may be formed of one or more conductive materials and may comprise, consist of, or consist essentially of conductively doped polysilicon and/or may comprise, consist of, or consist essentially of metal, such as a refractory metal, aluminum, copper, etc., or a metal-containing material, such as a refractory metal silicide layer, as well as other conductive materials. For example, the one or more conductors that form control gate $1235$ may initially extend over an upper surface of dielectric $1220$ and may be subsequently removed, e.g., by chemical mechanical planarization (CMP), so that an upper surface of control gate $1235$ might be flush (e.g., to within variations in the processing) with the upper surface of dielectric $1220$.

The upper surface (e.g., the uppermost surface) of control gate $1235$ might be at a vertical level that is above the uppermost surface of semiconductor $1212$, which is at vertical level $Z_0'$. Control gate $1235$ may extend downward to a vertical that is below vertical level $Z_0'$. Dielectric $1230$ and a portion of control gate $1235$ may be between semiconductor fins $1210_2$ and $1210_3$, e.g., between a sidewall of semiconductor fin $1210_2$ and a sidewall of semiconductor fin $1210_3$, so that dielectric $1230$ and the portion of control gate $1235$ separate semiconductor fin $1210_2$ from semiconductor fin $1210_3$. Dielectric $1230$ may wrap around a lowermost surface of control gate $1235$ and a portion of dielectric $1230$ may be between a sidewall of control gate $1235$ and a sidewall of semiconductor fin $1210_2$ and another portion of dielectric $1230$ may be between another sidewall of control gate $1235$ and a sidewall of semiconductor fin $1210_3$, as shown in FIG. 12C.

Source/drains $1240$ and $1242$ of transistor $1200$ may be respectively formed in semiconductor fins $1210_2$ and $1210_3$ so that the upper surfaces (e.g., the uppermost) surfaces of source/drains $1240$ and $1242$ are at the vertical level $Z_0'$ and thus coincide with the uppermost surfaces of semiconductor fins $1210_2$ and $1210_3$, as shown in FIG. 12C. For example, source/drains $1240$ and $1242$ may extend downward respectively from the uppermost surfaces of semiconductor fins $1210_2$ and $1210_3$. Source/drains $1240$ and $1242$ may have a different conductivity type, such as an n-type conductivity, than semiconductor $1212$, for example.

Conductive regions $1250$ and $1252$ may be respectively formed in semiconductor fins $1210_1$ and $1210_4$ so that the upper surfaces (e.g., the uppermost) surfaces of conductive regions $1250$ and $1252$ are at the vertical level $Z_0'$ and thus coincide with the uppermost surfaces of semiconductor fins $1210_1$ and $1210_4$, as shown in FIG. 12C. For example, conductive regions $1250$ and $1252$ may extend downward respectively from the uppermost surfaces of semiconductor fins $1210_1$ and $1210_4$. Conductive regions $1250$ and $1252$ may have the same conductivity type, such as a p-type conductivity, as semiconductor $1212$, for example.

An arrow $1255$ in FIG. 12C shows that the current may generally follow a curved path (e.g., a concave curve) as it flows from source/drain $1240$ to source/drain $1242$ when transistor $1200$ is activated. For example, the current flow may have a downward trajectory in semiconductor fin $1210_2$ and an upward trajectory in semiconductor fin $1210_3$, e.g., a vertical downward component in semiconductor fin $1210_2$ and a vertical upward component in semiconductor fin $1210_3$. For example a channel (e.g., a concave channel) may be formed in semiconductor fins $1210_2$ and $1210_3$ on either side of control gate $1235$ and dielectric $1230$ and in the portion of semiconductor $1212$ that is below (e.g., vertically below) control gate $1235$ and dielectric $1230$, when transistor $1200$ is activated. For example, the channel may be concave relative to (e.g., when viewed from) the uppermost surfaces semiconductor fins $1210_2$ and $1210_3$.

Positioning the source/drains $1240$ and $1242$ of transistor $1200$ so that their upper (e.g., uppermost) surfaces are above uppermost ends of dielectric (e.g., gate dielectric) $1230$ of transistor $1200$ allows the distance D3 (FIG. 12C) in the x-direction between source/drains $1240$ and $1242$ to be less than the distance D2 in the x-direction between the source/drains $115$ and $117$ of a finFET $100$ (FIG. 4). The decreased distance allows for more transistors $1200$ in the x-direction, e.g., under a stacked memory array to accommodate for more memory cells in a stack of memory cells.

Figure 12D:
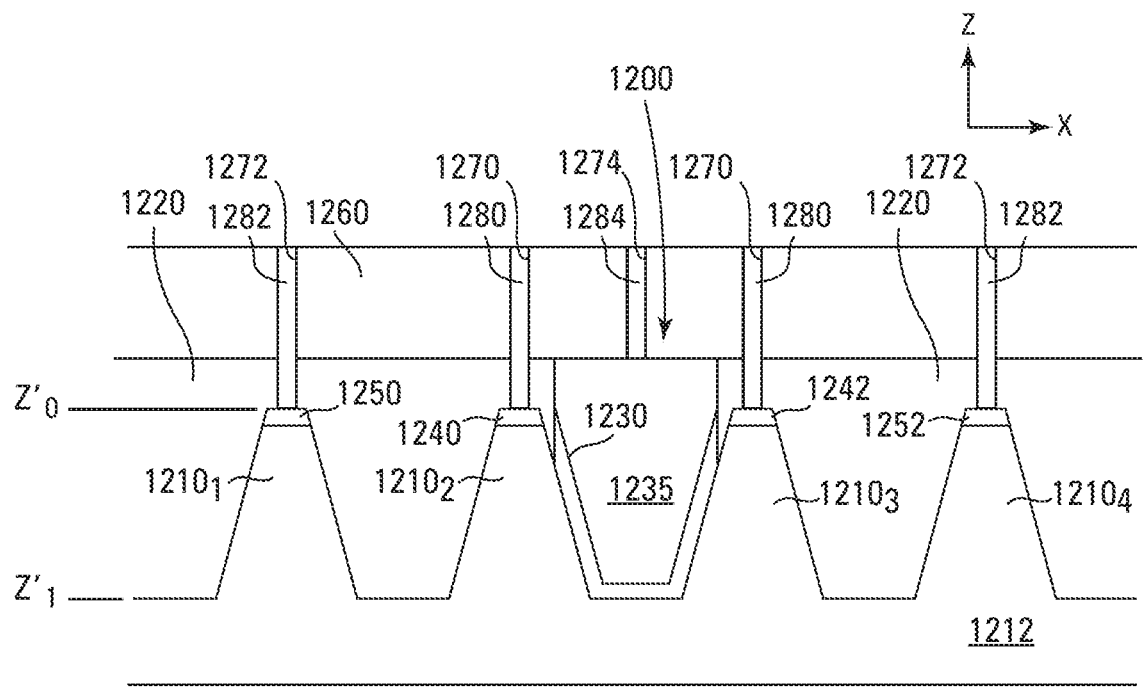

A dielectric $1260$, e.g., a bulk dielectric, may then be formed over dielectric $1220$ and control gate $1235$, as shown in FIG. 12D. One example for dielectric $1260$ would be a doped silicate glass. Another example for dielectric $1260$ would be TEOS (tetraethylorthosilicate), silicon dioxide, etc.

Dielectric $1260$ may be patterned to expose portions of dielectric $1260$ directly over (e.g., vertically aligned with) source/drains $1240$ and $1242$, conductive regions $1250$ and $1252$, and control gate $1235$ for removal. The exposed portions of dielectric $1260$ directly over source/drains $1240$ and $1242$, conductive regions $1250$ and $1252$, and control gate $1235$ may then be removed, such as by etching, respectively stopping on or within source/drains $1240$ and $1242$, conductive regions $1250$ and $1252$, and control gate $1235$ to form openings $1270$ that expose source/drains $1240$ and $1242$, openings $1272$ that expose conductive regions $1250$ and $1252$, and an opening $1274$ that exposes control gate $1235$, as shown in FIG. 12D.

Contacts, such as source/drain contacts $1280$, may be formed in the openings $1270$, e.g., in direct physical contact with source/drains $1240$ and $1242$, as shown in FIG. 12D. Contacts, such as well (e.g., tub) contacts $1282$, may be formed in the openings $1272$, e.g., in direct physical contact with conductive regions $1250$ and $1252$, as shown in FIG.

12D. For example, the portion of semiconductor 1212, and the semiconductor fins $1210_1$ and $1210_4$ on either side of transistor 1200 may form a conductive well (e.g., conductive tub), such as a p-type well. A contact, such as a gate contact 1284, may be formed in opening 1274, e.g., in direct physical contact with control gate 1235, as shown in FIG. 12D.

Contacts 1280, 1282, and 1284 may be generally formed from one or more conductors. For example, the one or more conductors may comprise, consist of, or consist essentially of a metal or a metal-containing material and might be aluminum, copper, a refractory metal, or a refractory metal silicide.

Figure 13:
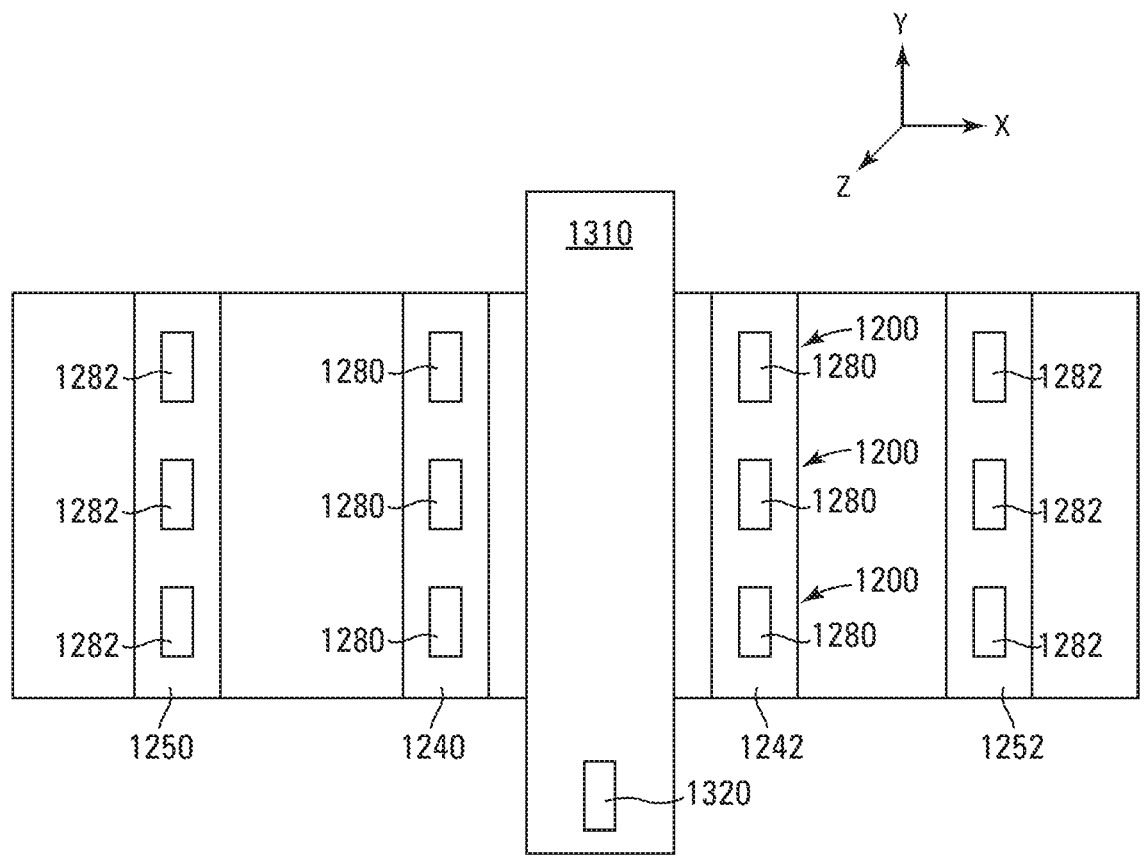
FIG. 13 is a top view of FIG. 12D.

FIG. 13 is a top view (e.g., in an x-y plane) of FIG. 12D. In FIG. 13, a plurality of transistors 1200 may be commonly coupled to a control line 1310. For example, control gates 1235 of transistors 1200 may be commonly coupled to or may form a portion of control line 1310. For some embodiments, instead of coupling a contact 1284 to control line 1310 by coupling contact 1284 to a control gate 1235 over a channel, as shown in FIG. 12D, a contact 1320 might be coupled to control line 1310, as shown in FIG. 13, e.g., where control line is over an isolation region.

Figure 14:
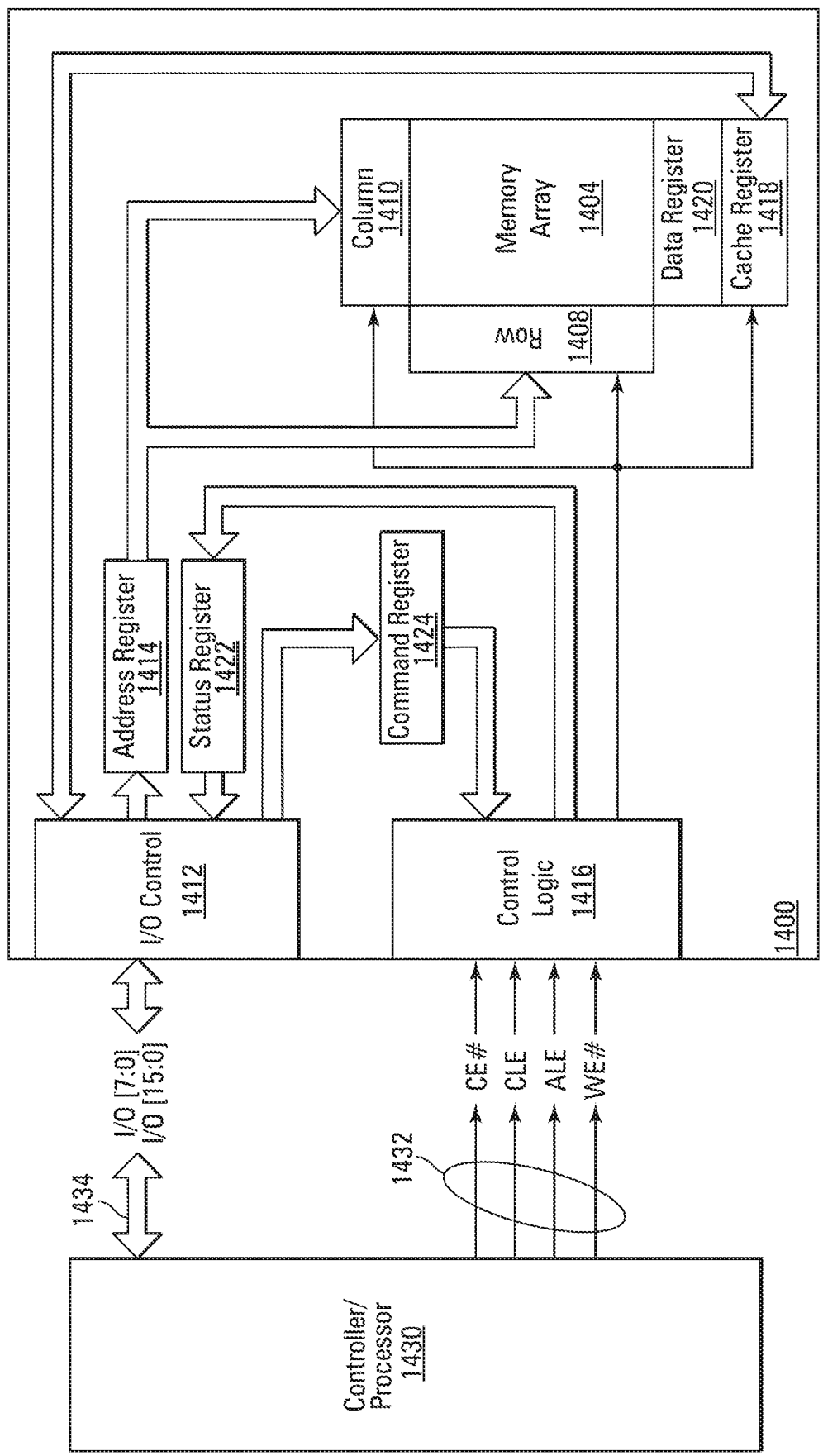
FIG. 14 is a simplified block diagram of an electronic system, according to an embodiment.

FIG. 14 is a simplified block diagram of an electronic device, e.g., an integrated circuit device, such a memory device 1400, in communication with a controller 1430, such as a memory controller, e.g. a host controller, as part of an electronic system, according to an embodiment. Memory device 1400 might be a NAND flash memory device, for example.

Controller 1430 might include a processor, for example. Controller 1430 might be coupled to host, for example, and may receive command signals (or commands), address signals (or addresses), and data signals (or data) from the host and may output data to the host.

Memory device 1400 includes an array of memory cells 1404. Memory array 1404 may be a stacked memory array, e.g., often referred to as three-dimensional memory array. Transistors, such as finFETs 600 and or transistors 1200, might be coupled to access lines and/or control lines in memory array 1404. For example, a plurality of finFETs 600 and or transistors 1200 might be located under memory array 1404.

A row decoder 1408 and a column decoder 1410 might be provided to decode address signals. Address signals are received and decoded to access memory array 1404.

Memory device 1400 may also include input/output (I/O) control circuitry 1412 to manage input of commands, addresses, and data to the memory device 1400 as well as output of data and status information from the memory device 1400. An address register 1414 is in communication with I/O control circuitry 1412, row decoder 1408, and column decoder 1410 to latch the address signals prior to decoding. A command register 1424 is in communication with I/O control circuitry 1412 and control logic 1416 to latch incoming commands. Control logic 1416 controls access to the memory array 1404 in response to the commands and generates status information for the external controller 1430. The control logic 1416 is in communication with row decoder 1408 and column decoder 1410 to control the row decoder 1408 and column decoder 1410 in response to the addresses.

Control logic 1416 can be included in controller 1430, for example. Controller 1430 can include other circuitry, firmware, software, or the like, whether alone or in combination. Controller 1430 can be an external controller (e.g., in a separate die from the memory array 1404, whether wholly or in part) or an internal controller (e.g., included in a same die as the memory array 1404).

Control logic 1416 is also in communication with a cache register 1418. Cache register 1418 latches data, either incoming or outgoing, as directed by control logic 1416 to temporarily store data while the memory array 1404 is busy writing or reading, respectively, other data.

During a write operation, data is passed from the cache register 1418 to data register 1420 for transfer to the memory array 1404; then new data is latched in the cache register 1418 from the I/O control circuitry 1412. During a read operation, data is passed from the cache register 1418 to the I/O control circuitry 1412 for output to controller 1430 and subsequent output to a host; then new data is passed from the data register 1420 to the cache register 1418. A status register 1422 is in communication with I/O control circuitry 1412 and control logic 1416 to latch the status information for output to the controller 1430.

Memory device 1400 receives control signals at control logic 1416 from controller 1430 over a control link 1432. The control signals may include at least a chip enable CE #, a command latch enable CLE, an address latch enable ALE, and a write enable WE #. Memory device 1400 receives command signals (which represent commands), address signals (which represent addresses), and data signals (which represent data) from controller 1430 over a multiplexed input/output (I/O) bus 1434 and outputs data to controller 1430 over I/O bus 1434.

For example, the commands are received over input/output (I/O) pins [7:0] of I/O bus 1434 at I/O control circuitry 1412 and are written into command register 1424. The addresses are received over input/output (I/O) pins [7:0] of bus 1434 at I/O control circuitry 1412 and are written into address register 1414. The data are received over input/output (I/O) pins [7:0] for an 8-bit device or input/output (I/O) pins [15:0] for a 16-bit device at I/O control circuitry 1412 and are written into cache register 1418. The data are subsequently written into data register 1420 for programming memory array 1404. For another embodiment, cache register 1418 may be omitted, and the data are written directly into data register 1420. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 14 has been simplified. It should be recognized that the functionality of the various block components described with reference to FIG. 14 may not necessarily be segregated to distinct components or component portions of an integrated circuit device. For example, a single component or component portion of an integrated circuit device could be adapted to perform the functionality of more than one block component of FIG. 14. Alternatively, one or more components or component portions of an integrated circuit device could be combined to perform the functionality of a single block component of FIG. 14.

Additionally, while specific I/O pins are described in accordance with popular conventions for receipt and output of the various signals, it is noted that other combinations or numbers of I/O pins may be used in the various embodiments.

Figure 15:
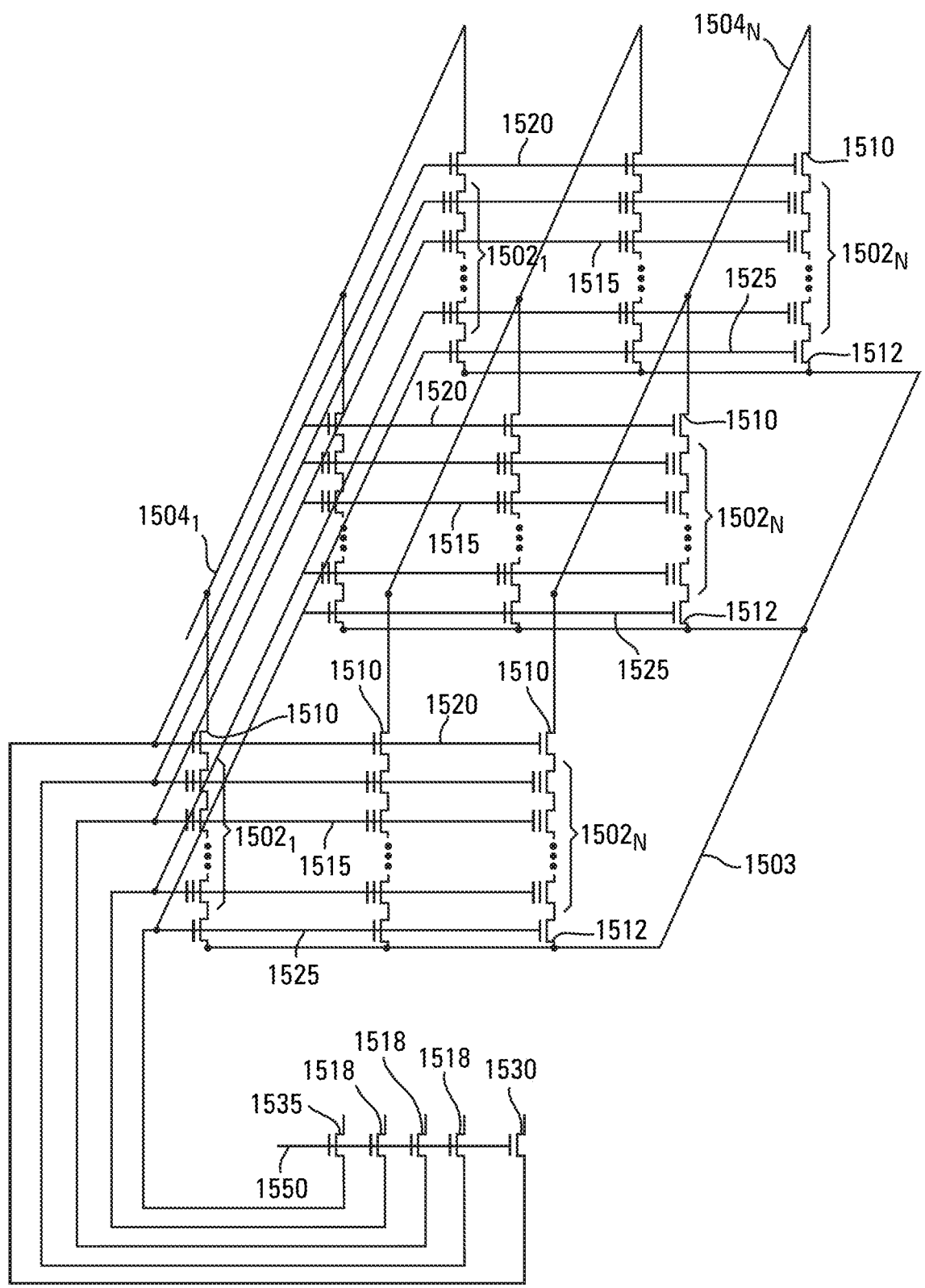
FIG. 15 is a schematic representation of a portion of a stacked memory array, according to an embodiment.

FIG. 15 is a schematic representation of a portion of a stacked (e.g., a three-dimensional) memory array, such as a portion of memory array 1404. In FIG. 15, vertical strings 1502 (e.g., NAND strings) of series-coupled memory cells may be coupled between a source 1503 and a data line, such as a bit line 1504. For example, vertical strings $1502_1$ to $1502_N$ may be respectively coupled between source 1503 and bit lines $1504_1$ to $1504_N$.

A select transistor 1510, such as a drain select transistor, may be coupled between a respective string 1502 and a respective bit line 1504, and may be configured to selectively couple the respective string 1502 to the respective bit line 1504. A select transistor 1512, such as a source select transistor, may be coupled between a respective string 1502 and the source 1503, and may be configured to selectively couple the respective string 1502 to the source 1503.

Memory cells at a common vertical level within the strings 1502 might be commonly coupled to a respective one of a plurality of access lines (e.g., word lines). For example, the memory cells at one vertical level might be commonly coupled to a word line 1515, such as a local word line. The word lines 1515, for example, might be commonly coupled to a transistor 1518, such as a pass transistor. For example, transistor 1518 may be configured to selectively couple the commonly coupled word lines 1515 to an access-line driver, e.g., a word-line driver.

Select transistors 1510 may be commonly coupled to select lines 1520, such as drain select lines, and select transistors 1512 may be commonly coupled to select lines 1525, such as source select lines. Select lines 1520 might be commonly coupled to a transistor 1530, such as a pass transistor. For example, transistor 1530 may be configured to selectively couple the commonly coupled select lines 1520 to a select-line driver, e.g., a drain-select-line driver. Select lines 1525 might be commonly coupled to a transistor 1535, such as a pass transistor. For example, transistor 1535 may be configured to selectively couple the commonly coupled select lines 1525 to a select-line driver, e.g., a source-select-line driver.

For some embodiments, transistors 1518, 1530, and 1535 may be configured as (e.g., may be the same as) the finFETs 600 described above in conjunction with FIGS. 6-10 and 11A-11F or configured as (e.g., may be the same as) the transistors 1200 described above in conjunction with FIGS. 12A-12D and FIG. 13. Transistors 1518, 1530, and 1535 may be commonly coupled to a control line 1550 that may be configured as the control lines 610 described above in conjunction with FIGS. 6-10 or the control line 1310 described above in conjunction with FIG. 13. For some embodiments, transistors 1518, 1530, and 1535 may be under the array shown in FIG. 15.

Note that there may be a transistor 1518 commonly coupled to the word lines that are commonly coupled the memory cells at each common vertical level within the strings 1502, for example. Therefore, as the number of memory cells in strings 1502 increases, the number of transistors 1518 may increase. The increased number of transistors 1518 may make it difficult to fit the increased number of transistors 1518 and any associated wiring under the array.

The reduced distance D1 between the source/drains 615 and 617 due to the upper surfaces of source/drains 615 and 617 being below (e.g., a vertical level below) the uppermost surface of semiconductor fin 720 in FIG. 9 or a reduced distance D3 between source/drains 1240 and 1242 due to the upper surfaces of source/drains 1240 and 1242 being above (e.g., vertically above) the uppermost ends of gate dielectric 1230 in FIG. 12C may allow for more transistors under the array, for example.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A transistor, comprising:
a first semiconductor fin;
a second semiconductor fin having a first side adjacent a first side of the first semiconductor fin;
a third semiconductor fin adjacent a second side of the first semiconductor fin;
a fourth semiconductor fin adjacent a second side of the second semiconductor fin;
a first source/drain region in the first semiconductor fin and extending downward from an uppermost surface of the first semiconductor fin;
a second source/drain region in the second semiconductor fin and extending downward from an uppermost surface of the second semiconductor fin;
a first conductive region in the third semiconductor fin and extending downward from an uppermost surface of the third semiconductor fin;
a second conductive region in the fourth semiconductor fin and extending downward from an uppermost surface of the fourth semiconductor fin;
a dielectric between the first and second semiconductor fins and adjacent to sidewalls of the first and second semiconductor fins; and
a control gate over the dielectric and between the first and second semiconductor fins and extending to a level below upper surfaces of the first and second source/drain regions;
wherein the first semiconductor fin, the second semiconductor fin, the third semiconductor fin and the fourth semiconductor fin each have a first conductivity type;
wherein the first source/drain region and the second source/drain region each have a second conductivity type different than the first conductivity type; and
wherein the first conductive region and the second conductive region each have the first conductivity type.

* * * * *